United States Patent

Mazhar et al.

Patent Number: 5,994,951
Date of Patent: Nov. 30, 1999

[54] AUTOMATIC-TUNING CIRCUIT FOR INTEGRATED CONTINUOUS-TIME MOSFET-C FILTERS

[75] Inventors: Salman Mazhar, Bloomington; Marius Dina, Burnsville; William W. Leake, Eagan, all of Minn.

[73] Assignee: VTC Inc., Bloomington, Minn.

[21] Appl. No.: 09/009,063

[22] Filed: Jan. 20, 1998

Related U.S. Application Data

[60] Provisional application No. 60/036,194, Jan. 21, 1997.

[51] Int. Cl.$^6$ .................................................. H03K 5/00
[52] U.S. Cl. ...................... 327/553; 327/552; 327/558; 327/103; 327/156; 330/305
[58] Field of Search ................... 327/552, 553, 327/558, 103, 156, 147; 330/305, 306

[56] References Cited

U.S. PATENT DOCUMENTS

| | | | |
|---|---|---|---|
| 2,996,349 | 8/1961 | Mauch | 346/74 |
| 4,551,772 | 11/1985 | Sliger | 360/46 |
| 4,639,794 | 1/1987 | Ferrier | 360/46 |
| 4,760,472 | 7/1988 | Minuhin et al. | 360/46 |
| 4,763,081 | 8/1988 | Jason | 330/149 |
| 4,821,125 | 4/1989 | Christensen et al. | 360/31 |
| 4,853,800 | 8/1989 | Schulz | 360/46 |
| 4,873,661 | 10/1989 | Tsividis | 364/807 |
| 4,918,338 | 4/1990 | Wong | 327/553 |
| 4,979,189 | 12/1990 | Wile | 375/95 |
| 5,124,593 | 6/1992 | Michel | 327/554 |
| 5,132,852 | 7/1992 | Price, Jr. | 360/46 |
| 5,168,395 | 12/1992 | Klassen et al. | 360/46 |
| 5,243,548 | 9/1993 | Gazsi | 364/602 |
| 5,245,646 | 9/1993 | Jackson et al. | 377/2 |
| 5,251,162 | 10/1993 | Gazsi | 364/602 |
| 5,258,877 | 11/1993 | Leake et al. | 360/51 |
| 5,260,842 | 11/1993 | Leake et al. | 360/51 |
| 5,293,058 | 3/1994 | Tsividis | 257/364 |
| 5,341,387 | 8/1994 | Nguyen | 371/45 |
| 5,345,342 | 9/1994 | Abbott et al. | 360/48 |
| 5,357,524 | 10/1994 | Shimpuku et al. | 371/30 |
| 5,381,361 | 1/1995 | Kirk et al. | 364/807 |
| 5,391,999 | 2/1995 | Early et al. | 327/337 |
| 5,442,583 | 8/1995 | Kirk et al. | 364/841 |
| 5,519,309 | 5/1996 | Smith | 327/103 |

OTHER PUBLICATIONS

Banu & Tsividis, An Elliptic Continuous—Time CMOS Filter with On–Chip Automatic Tuning IEEE Jounral Solid–State Circuits, vol. sc–20, No.6, Dec. 1985.

Tsividis, Banu and Khoury, Continuous—Time MOS-FET—C Filters in VLSI, IEEE Journal Solid–State Circuits, vol. sc–21, No. 1, Feb. 1986.

Weldon, Jr., Coding Gain of Reed–Solomon Codes on Disk Memories IEEE Journal Solid–STate Circuits, vol., Supercomm/1cc '92: Discovering a New World of Communications, 1992.

*Primary Examiner*—Dinh T. Le
*Attorney, Agent, or Firm*—Kinney & Lange

[57] ABSTRACT

An integrated, tuning circuit for tuning a MOSFET-C filter contains a tuning MOSFET and a differential amplifier. A current source is connected to the drain of the tuning MOSFET. The output of the amplifier is coupled to the drain of the tuning MOSFET and to a terminal that connects to the drains of the MOSFETs of the filter, so that the equivalent resistance of the filter is dependant on the current. The current source is coupled to a reference current generator, such that current supplied by the current source to the tuning MOSFET is proportional to the current supplied in the reference current generator, which in turn varies with process and environmental conditions of a capacitance. As a result, changes in process and environmental conditions oppositely affect the capacitance and resistance in the filter, resulting in a fixed RC product and fixed frequency response from the filter.

10 Claims, 3 Drawing Sheets

AUTOMATIC-TUNING CIRCUIT FOR INTEGRATED CONTINUOUS-TIME MOSFET-C FILTERS

CROSS-REFERENCE TO RELATED APPLICATIONS

This application claims the benefit of Provisional Application No. 60/036,194 filed Jan. 21, 1997 for "Automatic Tuning Scheme for Accurate Frequency Response in Integrated MOSFET-C Filters" Salman Mazhar, William W. Leake and Marius Dina.

BACKGROUND OF THE INVENTION

The present invention concerns tuners for integrated continuous-time filters, particularly tuners for MOSFET-C filters in the reach channel of a disk drive.

Filters are input-output devices that reject or pass signals based on their frequency content, that is, the distribution of their energy across a range of frequencies. Every filter has a pass band that defines its effect on the frequency content of input signals. For example, low-pass filters pass signal frequencies below a certain frequency known as a cut-off frequency, and reject frequencies above the cut-off frequency, whereas high-pass filters pass frequencies above a cut-off frequency. Band-pass filters pass frequencies that are between lower and upper cut-off frequencies.

In addition to their pass-band characteristics, filters are also characterized according to their construction and temporal operation. Filters typically comprise a network of resistors and capacitors and transistors, which defines the pass band, or frequency response. When most of these components are fabricated on a common substrate, or foundation, the filter is known as an integrated filter. As for temporal operation, filters operate either in continuous time, which allows their inputs and outputs to change at any time, or in discrete time, which allows changes at only specific, time increments.

One common problem with integrated, continuous-time filters is that the effective values of capacitors and resistors varies not only because of changes in operating temperature but also because of process variations in building integrated circuits. The changes in effective value of these components causes the filter to reject or pass undesirable signals, ultimately preventing the filters from operating as intended. Compensating for fabrication-related variability and on-going component changes requires "tuning," or adjusting, the value of one or more filter components, not only initially to establish the desired frequency response, but also continually to maintain the desired frequency response of the filter throughout its operation.

One solution to the component variability problems is to use a specific type of filter known as MOSFET-C filters, which combine capacitors with metal-oxide-semiconductor, field-effect transistors (MOSFET) used as voltage-controlled resistors. In such filters, tuning, or adjusting, a control voltage of the MOSFET varies the resistance and thus tunes frequency response. In conventional tuning schemes for MOSFET-C filters, the control voltage is adjusted using a phase-locked-loop-based tuning circuit, which comprises not only a phase detector and a charge pump, but also a voltage-controlled oscillator. Although these schemes provide accurate frequency-response control, they do so only at the expense of circuit complexity and size.

Accordingly, there is a continuing need for alternative tuning schemes which are simple, yet allow accurate tuning of integrated, continuous-time MOSFET-C filters.

SUMMARY OF THE INVENTION

An integrated, tuning circuit for tuning a MOSFET-C filter is disclosed. The tuning circuit contains first and a second reference voltage inputs, a tuning MOSFET, a differential amplifier and a current source. The tuning MOSFET has a gate, source and drain, with the source coupled to the first reference voltage input. The amplifier has a first and second input, and an output. The first input is coupled to the drain of the tuning MOSFET, the second input is coupled to the second reference voltage input, and the output is coupled to the gate of the tuning MOSFET. A current source is coupled to the drain of the tuning MOSFET. The current source is coupled to a reference current generator, such that the current supplied by the current source to the tuning MOSFET is proportional to the current in the reference current generator. The reference current generator supplies a current source which varies with capacitance. Therefore, the capacitance and resistance of the filter are inversely proportional, which results in an approximately fixed frequency response from the filter.

DETAILED DESCRIPTION OF THE PREFERRED EMBODIMENTS

Figure 1:
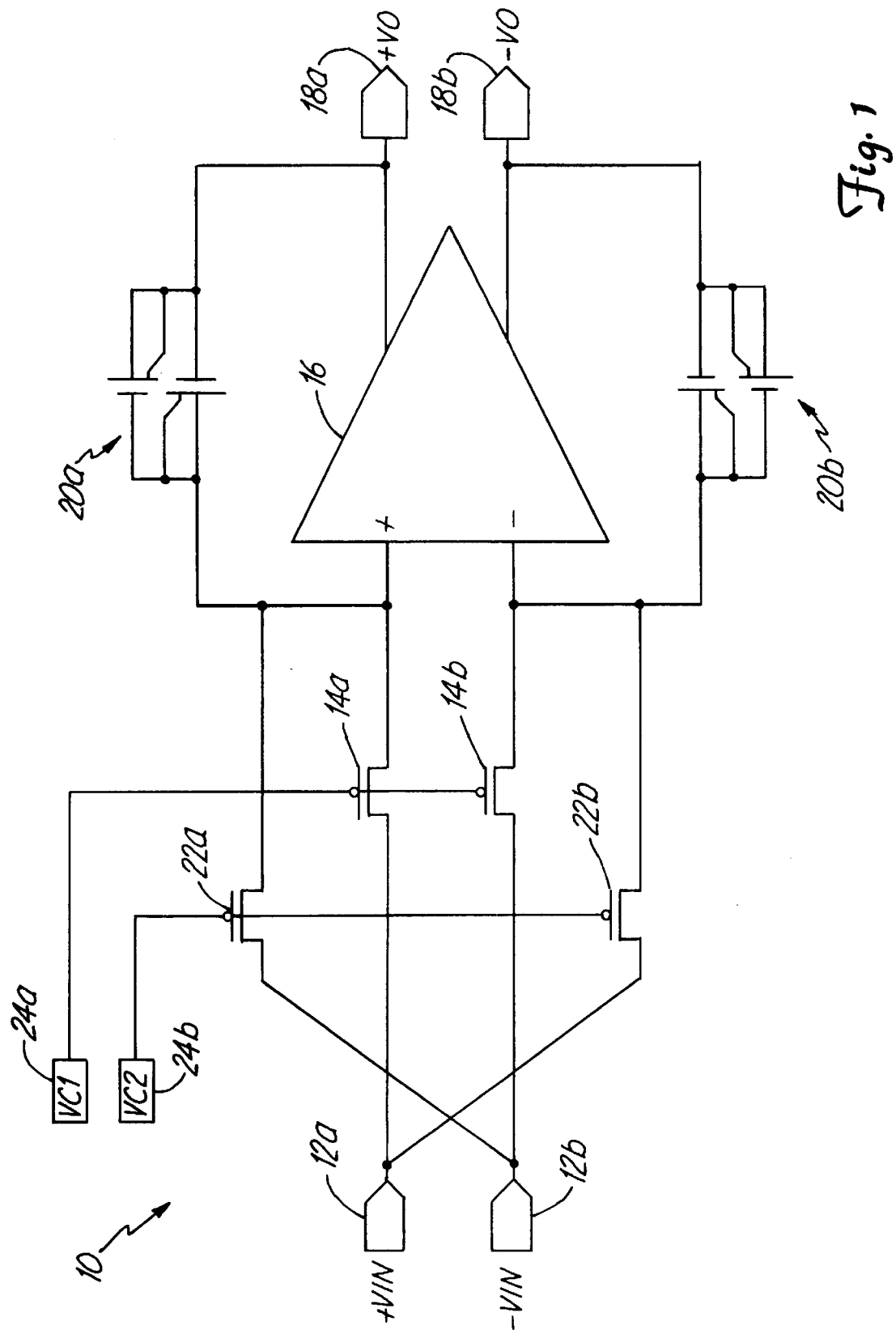
FIG. 1 is a schematic diagram of a tunable filter according to the presently preferred embodiment of the present invention.

FIG. 1 illustrates filter circuit 10, which is a balanced, differential-input, continuous-time MOSFET-C filter. MOSFET-C filters are relatively insensitive to parasitics, have a good high frequency performance, modularity and simplicity of design, and posses a moderate to high dynamic range. MOSFET-C filters are derived from classical RC active filters, but the resistors are replaced by MOSFETs, which function as resistors.

Filter 10 includes a pair of inputs 12a and 12b connected to the source nodes of MOSFETs 14a and 14b, whose drains are connected to separate differential inputs of differential amplifier 16. Filter outputs are provided at terminals 18a and 18b. Capacitors 20a and 20b are connected between the inputs and outputs of amplifier 16. Additional MOSFETs 22a and 22b have their sources connected to input terminals 12b and 12a, respectively and their drains connected to the drains of MOSFETs 14a and 14b, respectively. Tuning signals are provided to filter 10 at terminal 24a, connected to the gates of MOSFETs 14a and 14b, and at terminal 24b, connected to the gates of MOSFETs 22a and 22b. The MOSFETs form an equivalent resistance which, with the capacitances 20, form the RC filter characteristics. However, any shift in the characteristics of the MOSFETs or of the capacitors, shifts the RC filter characteristics, and hence the frequency response of the filter.

The filter cut-off frequency of circuit 10 is controlled by the RC product of the filter. The RC product will vary due to fabrication tolerances, temperature variations and aging. To achieve a more constant RC product, and thus more precise filtering, some form of on-chip tuning is required. The tuning adjusts the resistance of the filter MOSFETs. By operating the MOSFETs of filter circuit 10 in the triode region, the resistances of the MOSFETs can be adjusted by the respective gate voltages. Therefore, the cut-off frequency of filter circuit 10 can be accurately controlled.

Figure 2:
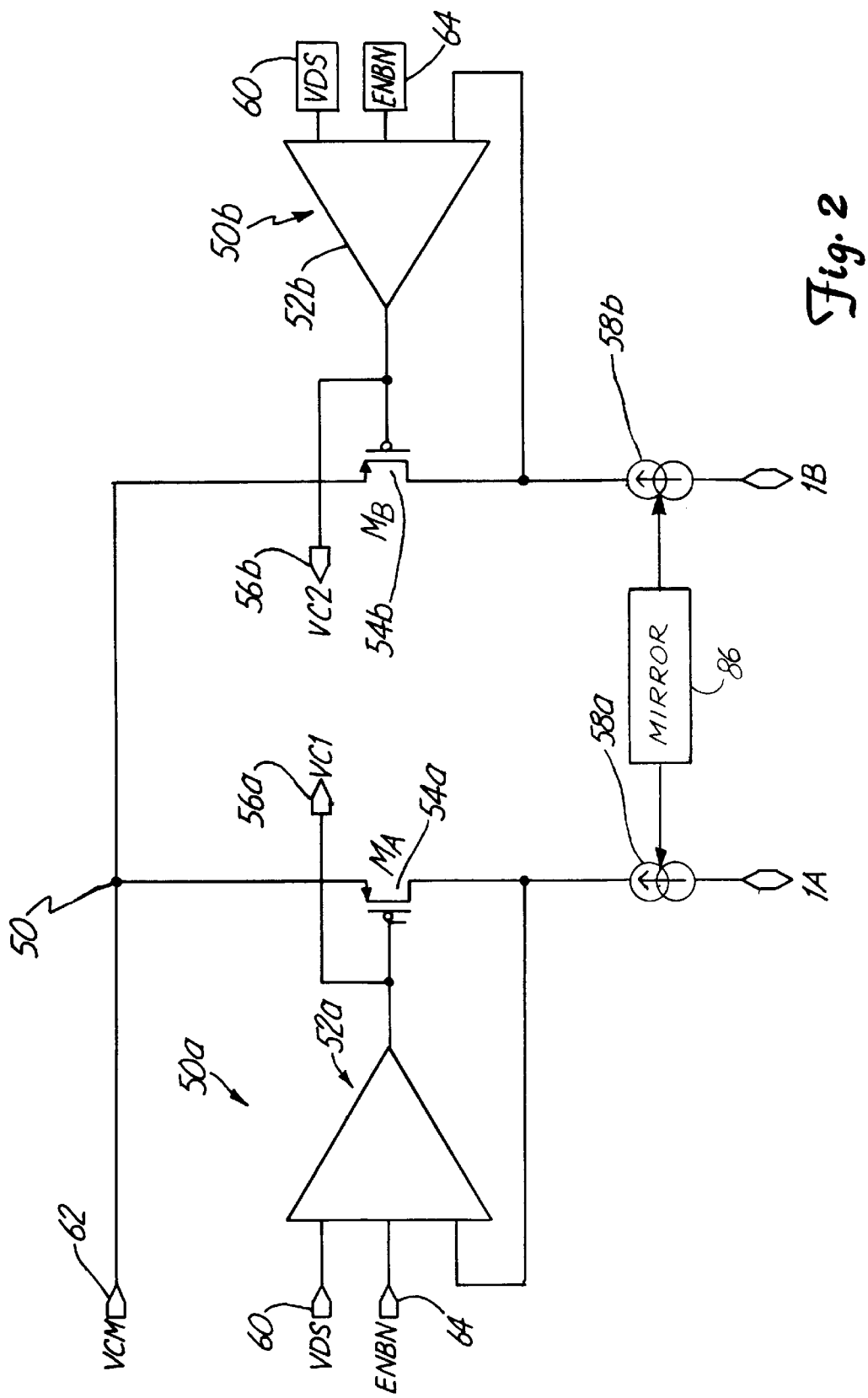
FIG. 2 is a schematic diagram of an automatic turning circuit for the filter illustrated in FIG. 1 according to the present invention.

FIG. 2, which illustrates the teachings of the present invention, shows an automatic-tuning circuit 50 for filter circuit 10. Filter circuit 10 is tuned by applying a control voltage to the gate of the MOSFETs. Tuning circuit 50, manufactured on the same chip as filter circuit 10, produces a control voltage, which controls the resistance of the MOSFETs in filter circuit 10. Tuning circuit 50 has symmetrical left and right halves 50a and 50b, which comprise differential amplifiers 52a and 52b, tuning MOSFETs 54a and 54b, control voltage terminals 56a and 56b, current sources 58a and 58b, reference input voltage terminal 60, common-mode voltage terminal 62, and enable input terminals 64. (Although illustrated as two separate terminals, the two terminals 60 are coupled together for both halves 50a and 50b of the circuit; likewise, the two terminals 64 are also coupled together for both halves of the circuit.)

Tuning MOSFETs 54a and 65b each include three control nodes: a gate, a source, and a drain. MOSFETs 54a and 54b are connected in a common source configuration. In the preferred embodiment, MOSFETs 54a and 54b are ratio matched, in terms of width W and length L, to MOSFETs 14 and 22 of filter circuit 10. Accordingly, the functions which would affect the MOSFETs of the filter, including fabrication, process tolerances, operating temperature variations, aging, etc. will also affect MOSFETs 54 of the tuning circuit, thus tending to cancel out the variations in fabrication and processing tolerances, operating temperature, aging, etc.

The sources of MOSFETs 54a and 54b are connected to terminal 62 to receive a common-mode reference voltage VCM. The drains of MOSFETs 54a and 54b are connected to the positive input of amplifiers 52a and 52b and respective current sources 58a and 58b.

Differential amplifiers 52a and 52b, which are preferably low-power operational amplifiers, each have positive and negative inputs, and an output. As shown in FIG. 2, the negative inputs of amplifiers 52a and 52b are connected to reference input terminal 60 to receive a drain-source voltage VDS. Amplifiers 52a and 52b maintain the drains of MOSFETs 54a and 54b at a voltage, with respect to the source nodes, equal to reference input voltage 60 (VDS). The outputs of amplifiers 52a and 52b are connected to the gates of MOSFETs 54a and 54b and to terminals 56a and 56b. When enable input 64 receives a selected voltage, amplifiers 52a and 52b are enabled, and the automatic tuning circuit operates to adjust the RC value of the filter circuit.

The tuning circuit 50 provides control voltages at terminals 56a and 56b to tune filter circuit 10. More particularly, terminals 56a and 56b are connected to terminals 24a and 24b of filter 10 so that the difference in the voltages VC1 and VC2 will adjust the equivalent resistance of MOSFETs 14 and 22 to thereby adjust the RC value of the filter and alter the frequency characteristics of the filter. Thus, the frequency characteristic of the filter is adjusted by applying control voltages 56a and 56b to the gates of the filter MOSFETs. The voltage difference may be established by differential amplifiers 52a and 52b, but most preferably they are established by adjusting the voltage across MOSFETs 54a and 54b to desired values so that the voltages at terminals 56a and 56b are set to a desired value for the desired frequency characteristics of the filter. Ordinarily, MOSFETs 54a and 54b are sized to meet the desired characteristics.

It can be shown that the frequency characteristics (transfer function) of filter 10 are directly proportional to both the difference of voltages of VC1 and VC2 and to a function based on the variation of the capacitance on the chip due to processing and environmental conditions. Consequently, if the voltages VC1 and VC2 are constant, while the equivalent resistance is constant, the frequency characteristics will vary with changes in processing and environmental conditions. The present invention is directed at offsetting the effects of processing and environmental conditions by adjusting the current to the tuning MOSFETs in proportion to the same processing and environmental conditions. More particularly, the present invention adjusts voltages VC1 and VC2 in accordance with process and environmental conditions by mirroring a reference current that itself is directly based on process and environmental conditions of a capacitor, and using the mirrored current to establish the equivalent resistance of MOSFETs 14 and 22 in filter 10 thereby offsetting the effects of the process and environmental conditions. The present invention relies on matching of like components and does not require any additional external reference beyond what is already available on the chip. A on-chip reference current adjusts the control voltages, and hence the resistance of the filter MOSFETs.

If the current sources 58a and 58b of tuning circuit 50 are constant, the equivalent resistance (Req) of filter 10 will also be constant. The Req value will remain constant in spite of environmental and processing changes. The capacitance, however, wills till vary as a result of environmental (temperature) or process conditions. This in turn will vary the frequency characteristics of filter circuit 10. Therefore, any changes in capacitance need to be compensated by an inverse change in resistance, to allow the RC product to remain constant. This can be achieved by making current sources 58a and 58b proportional to the capacitance on filter 10.

Figure 3:
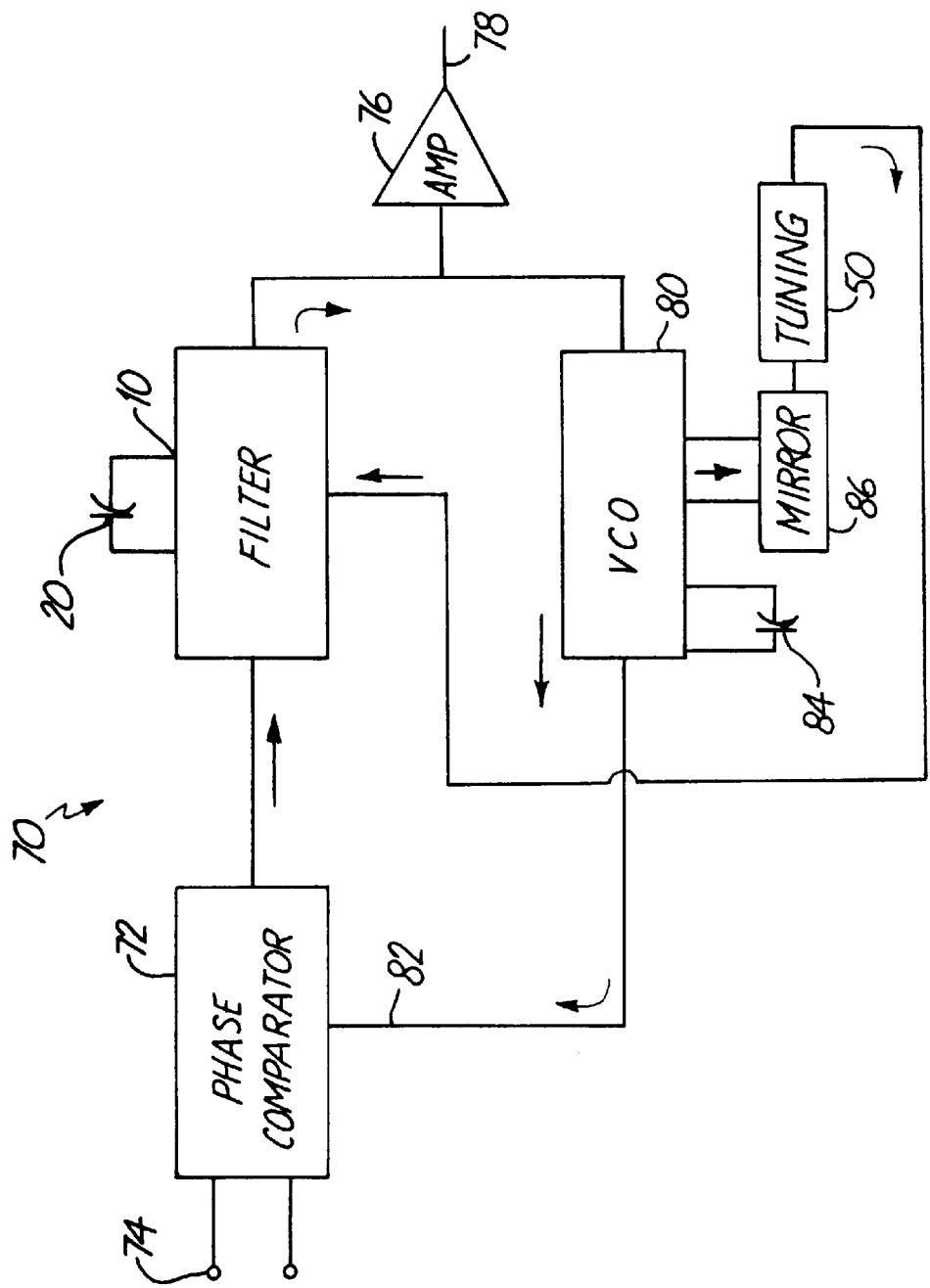
FIG. 3 is a block diagram of an integrated phase lock loop on a chip that includes the filter illustrated in FIG. 1 and the tuning circuit illustrated in FIG. 2.

In this respect, FIG. 3 illustrates a phase locked loop (PLL) circuit 70 as used in recovery of data from a disk. PLL 70 includes a phase comparator 72 receiving a first input at 74, such as from the head of the disk drive, and provides an output to a filter, such as filter 10 of FIG. 1. Filter 10 provides an output to operation amplifier 76, which in turn provides output signals at 78 to the data recovery circuits of the disk drive. Filter 10 also provides an input to a voltage controlled oscillator (VCO) 80, which in turn provides signals back to the second input 82 of phase comparator 72. Phase comparator 74 compares the signals at inputs 74 and 82 to establish data timing and set computer clocks, in a manner well known in the art. Noteworthy, VCO 80 also includes a capacitance 84. A current mirror 86 is connected to VCO 80 to mirror current from VCO 80 to the sources of MOSFETs 54 in tuning circuit 50.

As shown in FIG. 2, op amps 52a and 52b operate to maintain a fixed source-drain voltage of VCM-VDS, which ensures triode operation of MOSFETs 54a and 54b. Triode operation requires the source-drain voltage ($v_{sd}$) to be less than the sum of the gate-source voltage ($v_{gs}$) minus the threshold voltage ($V_{th}$). In a preferred embodiment, 60 millivolts keeps the MOSFETs deep in the triode region. Operation of MOSFETs 54a and 54b in their triode region provides a continuously variable linear resistance. When the MOSFETs operate in the triode region with a fixed source-drain voltage, the resistance of the MOSFETs is controlled by the gate voltage.

The gate-source voltages of MOSFETs 54a and 54b adjust themselves to maintain the drain-source resistance of both devices to a nearly-fixed value. Since the MOSFETs of tuning circuit 50 and filter circuit 10 are matched, the drain-source resistance of tuning circuit 50 will closely match the drain-source resistance of filter circuit 50. In tuning circuit 10, control voltages 56*a* and 56*b*, which are the respective gate voltages of MOSFETs 54*a* and 54*b*, adjust to maintain a nearly-fixed drain-source resistance. If the resulting control voltages 56*a* and 56*b* are applied to the MOSFETs of filter circuit 10, the resistance of the filter MOSFETs will closely equal the resistances of tuning MOSFETs 54*a* and 54*b*. Thus, tuning circuit 50 is controlling the equivalent resistance of filter 10.

In addition to adjusting the equivalent resistance (Req) in filter circuit 10, tuning circuit 50 tracks changes in capacitance. The present invention takes advantage of the fact that an accurate current reference already exists on the filter chip. The reference current is the current from VCO 80, shown in FIG. 3. VCO 80 will adjust the value of its current until the frequency of VCO 80 is the proper frequency to lock to the frequency of first input 74. The current of VCO 80 is directly proportional to capacitance 84, and is temperature and supply independent. Capacitor 20 of filter 10 is matched to capacitor 84 of VCO 80. Therefore, the frequency of filter 10 will vary in the same way as the frequency of VCO 80.

The current of VCO 80 is scaled down and mirrored, using current mirror 86, directly into tuning circuit 50, such that current sources 58*a* and 58*b* contain the current characteristic of the VCO current. Current mirror 86 may include one or more current mirrors. Current sources 58*a* and 58*b* are used to establish the resistances of MOSFETs 54*a* and 54*b*, which in turn establish control voltages 56*a* and 56*b*. By using the current from VCO 80 to establish the equivalent resistance (Req) of filter 10, the RC product can be made more-or-less constant because Req will vary inversely with the capacitance.

VCO 80 produces a current that varies inversely with capacitance by utilizing an external frequency source, such as a datarate clock. The current from VCO 80 is mirrored into tuning circuit 50 and used to control the resistance of MOSFETs 54*a* and 56*b*. The resistance of MOSFETs 54*a* and 54*b* establish control voltages 56*a* and 56*b*, which are applied to the gates of the filter MOSFETs to control their resistance. The equivalent of the resistances (Req) in filter circuit 10 is a function of the MOSFETs' geometry, the supply voltage (VCM-VDS), and the current mirrored from VCO 80. The value of the geometry and voltage are constant, which leaves Req inversely proportional to the current (Req≈1/I). Since the current from VCO 80 is proportional to capacitance 84 and capacitance 84 is matched to capacitance 20, the equivalent resistance (Req) of filter 10 is inversely proportional to capacitance 20. In other words, as the capacitance in the filter changes due to fabrication tolerances, Req changes in the opposite direction, causing the frequency to stay approximately fixed.

Although the present invention has been described with reference to preferred embodiments, workers skilled in the art will recognize that changes may be made in form and detail without departing from the spirit and scope of the invention.

What is claimed is:

1. An integrated circuit chip containing a loop circuit that includes an input circuit, an integrated tunable filter coupled to the input circuit and a reference current generator coupled between the filter and the input circuit, the filter having an integrated capacitance and an integrated resistance, the integrated resistance including a filter MOSFET having a gate, and an integrated tuning circuit coupled to the reference current generator for tuning the filter, the tuning circuit comprising:

first and second reference voltage inputs;

a tuning MOSFET having a gate and first and second controlled terminals, with the first controlled terminal being coupled to the fist reference voltage input;

a differential amplifier having a first input coupled to the second controlled terminal of the tuning MOSFET, a second input coupled to the second reference voltage input, and an output coupled to the gate of the tuning MOSFET and to the gate of the filter MOSFET; and a current source coupled to the second controlled terminal of the tuning MOSFET, the current source being coupled to the reference current generator so that current supplied by the current source to the tuning MOSFET is proportional to a current in the reference current generator.

2. The apparatus of claim 1, wherein the tuning MOSFET has a predetermined size relative the size of the filter MOSFET.

3. The apparatus of claim 1, wherein the first controlled terminal of the tuning MOSFET is a source and the second controlled terminal of the tuning MOSFET is a drain.

4. The apparatus of claim 1 and further comprising a current mirror connected between the reference current generator and the current source to mirror current in the reference current generator to the second controlled terminal of the tuning MOSFET.

5. The apparatus of claim 4, wherein the loop circuit is a phase lock loop, the input circuit is a phase detector and the reference current generator is a voltage controlled oscillator.

6. The apparatus of claim 1, wherein the filter is a balanced differential input filter having an additional integrated capacitance and an additional integrated resistance, the additional integrated resistance including an additional filter MOSFET, the tuning circuit further comprising:

an additional tuning MOSFET having a gate and first and second controlled terminals, with the first controlled terminal being coupled to the first reference voltage input;

an additional differential amplifier having a first input coupled to the second controlled terminal of the additional tuning MOSFET, a second input coupled to the second reference voltage input, and an output coupled to the gate of the additional tuning MOSFET and to the additional filter MOSFET, the output of the first-named differential amplifier being coupled to the first-named filter MOSFET; and an additional current source coupled to the second controlled terminal of the additional tuning MOSFET, the additional current source being coupled to the reference current generator so that current supplied by the additional current source to the additional tuning MOSFET of the second variable resistance is proportional to a current in the reference current generator, the first-named current source being coupled to the second controlled terminal of the first-named tuning MOSFET.

7. The apparatus of claim 6, wherein the first controlled terminal of each tuning MOSFET is a source and the second controlled terminal of each tuning MOSFET is a drain.

8. The apparatus of claim 6 and further comprising a first current mirror connected between the reference current generator and the first-named current source to mirror a current in the reference current generator to the second controlled terminal of the first-named tuning MOSFET, and a second current mirror connected between the reference current generator and the second current source to mirror the current in the reference current generator to the second controlled terminal of the second tuning MOSFET.

9. An automatic tuning circuit for tuning an integrated, continuous-time differential-input filter that is coupled to a phase detector and voltage controlled oscillator of a phase locked loop, the filter having a variable cut-off frequency based on first and second variable resistances, the variable resistances including respective first and second filter MOSFETs coupled to respective control nodes for varying the resistances and thus the cut-off frequency of the differential-input filter, the automatic tuning circuit comprising:

first and second reference voltage inputs;

first and second tuning MOSFETs having respective predetermined sizes realative the first and second filter MOSFETs and each other, each tuning MOSFET having a gate, drain, and source, with each source coupled to the first reference voltage input;

first and second differential amplifiers, with each having first and second inputs and an output, the first inputs coupled respectively to the drains of the first and second tuning MOSFETs, the second inputs coupled to the second reference voltage input, and the outputs coupled respectively to the gates of the first and second tuning MOSFETs and respectively to the control nodes of the first and second variable resistances; and first and second current sources coupled to the drains of the respective tuning MOSFETs, the current sources being coupled to the voltage controlled oscillator through a reference current generator so that first and second currents supplied respectively by the first and second current sources to the tuning MOSFETs are proportional to a current in the voltage controlled oscillator.

10. The circuit of claim 9 wherein the reference current generator comprises:

a first current mirror coupled between the voltage controlled oscillator and the first current source, for mirroring a version of a current in the voltage controlled oscillator to the drain of the first tuning MOSFET, and a second current mirror coupled between the voltage controlled oscillator and the second current source, for mirroring a version of the current in the voltage controlled oscillator to the drain of the second tuning MOSFET.

* * * * *

UNITED STATES PATENT AND TRADEMARK OFFICE
CERTIFICATE OF CORRECTION

PATENT NO. : 5,994,951
DATED : NOVEMBER 30, 1999
INVENTOR(S) : SALMAN MAZHAR ET AL.

It is certified that error appears in the above-identified patent and that said Letters Patent is hereby corrected as shown below:

Col. 1, line 16, delete "reach", insert -- read --

Col. 2, line 27, delete "turning", insert -- tuning --

Col. 4, line 29, delete "wills till", insert -- will still --

Col. 4, line 47, delete "74", insert -- 72 --

Col. 5, line 8, delete "resistance", insert -- resistances --

Col. 5, line 38, delete "56$b$", insert -- 54$b$ --

Col. 6, line 4, delete "fist", insert -- first --

Signed and Sealed this

Seventh Day of November, 2000

Attest:

Q. TODD DICKINSON

*Attesting Officer*     *Director of Patents and Trademarks*